United States Patent
Shabra

(10) Patent No.: US 8,390,495 B2
(45) Date of Patent: Mar. 5, 2013

(54) MIMO DELTA-SIGMA DELTA ANALOG-TO-DIGITAL CONVERTER USING NOISE CANCELING

(75) Inventor: Ayman Shabra, Woburn, MA (US)

(73) Assignee: MediaTek Singapore Pte. Ltd., Singapore (SG)

( * ) Notice: Subject to any disclaimer, the term of this patent is extended or adjusted under 35 U.S.C. 154(b) by 65 days.

(21) Appl. No.: 13/183,438

(22) Filed: Jul. 15, 2011

(65) Prior Publication Data

US 2013/0015987 A1  Jan. 17, 2013

(51) Int. Cl.
*H03M 3/00* (2006.01)

(52) U.S. Cl. ......... 341/143; 341/118; 341/120; 341/155

(58) Field of Classification Search .................. 341/118, 341/120, 143, 155
See application file for complete search history.

(56) References Cited

U.S. PATENT DOCUMENTS

| | | | | |
|---|---|---|---|---|
| 6,987,953 B2 * | 1/2006 | Morris et al. | .................. | 455/102 |
| 7,049,990 B2 * | 5/2006 | Ranganathan | .................. | 341/143 |
| 7,061,415 B2 * | 6/2006 | Magrath | ........................ | 341/143 |
| 7,136,430 B2 * | 11/2006 | Morris et al. | .................. | 375/316 |
| 7,190,288 B2 * | 3/2007 | Robinson et al. | ............. | 341/106 |
| 7,301,489 B2 * | 11/2007 | Lin | ............................... | 341/131 |
| 7,411,534 B1 | 8/2008 | Melanson | | |
| 2005/0068212 A1 | 3/2005 | Jensen | | |
| 2006/0187100 A1 * | 8/2006 | Kurose et al. | .................. | 341/143 |
| 2007/0290906 A1 * | 12/2007 | Reefman et al. | ............... | 341/143 |
| 2008/0055133 A1 * | 3/2008 | Chakrabartty | ................. | 341/143 |
| 2008/0297386 A1 * | 12/2008 | Maloberti et al. | ............. | 341/143 |
| 2009/0296666 A1 | 12/2009 | Rimini | | |
| 2010/0097258 A1 * | 4/2010 | Koli | .............................. | 341/155 |
| 2011/0163900 A1 * | 7/2011 | Pagnanelli | ..................... | 341/143 |
| 2012/0038498 A1 * | 2/2012 | Oshima et al. | ................. | 341/110 |

OTHER PUBLICATIONS

"International Search Report" mailed on Jun. 22, 2012 for International application No. PCT/SG2011/000296, International filing date: Aug. 29, 2011.

\* cited by examiner

*Primary Examiner* — Linh Nguyen
(74) *Attorney, Agent, or Firm* — Winston Hsu; Scott Margo

(57) ABSTRACT

A multi-input-multi-output-system (MIMO) is provided that includes a first input signal and a second input signal. A plurality of analog-to-digital converter (ADC) cell structures receive as input a combination of the first input signal and the second input signal as well as a combination of quantization noise signals from the respective other ADC cell structures of the plurality of ADC cell structures. The ADC cell structures generate a plurality of first output signals and the noise quantization signals. A plurality of adder modules receive the first output signals and performing either addition or subtraction on a selected combination of the first output signals, the adder modules generate a plurality of second output signals. A plurality of division modules receive the second output signals and perform a division operation on the second output signals by a predetermined factor. The division modules generate a plurality of final output signals of the MIMO.

20 Claims, 2 Drawing Sheets

# MIMO DELTA-SIGMA DELTA ANALOG-TO-DIGITAL CONVERTER USING NOISE CANCELING

BACKGROUND

The invention is related to the field of analog-to-digital converters (ADCs), and in particular to ADCs supporting multi-input and multi-output systems.

Multi-input multi-output (MIMO) systems offer advantages to wireless receivers such as improved data rates or improved channel reliability. Such systems rely on the use of multiple antennae having special separation that effectively create multiple communication channels between the transmitters and receivers. These channels can be utilized to then achieve the advantage mentioned above.

The use of multiple antennae is generally implies the use of multiple receiver building blocks from the RF frontend all the way to the ADC. This results in an increase in area, cost, and power consumption of the receiver. A number of solutions have been proposed to mitigate the impact of these increases, which revolve around the idea of multiplexing. Multiplexing allows for a single receiver to be shared with multiple antennae. The idea's include time division, frequency division, and code division multiplexing. Although these techniques do reduce the area of the receiver, they degrade the signal-to-noise performance.

The present invention offers a solution where a reduction in MIMO ADC area and power is achieved while the signal-to-noise ratio remains unchanged. This solution is based on the use of noise coupled delta-sigma ADCs as will be explained next.

SUMMARY

According to one aspect of the invention, there is provided a multi-input-multi-output-system (MIMO). The MIMO includes a first input signal and a second input signal. A plurality of analog-to-digital converter (ADC) cell structures receive as input a combination of the first input signal and the second input signal as well as a combination of quantization noise signals from the respective other ADC cell structures of the plurality of ADC cell structures. The ADC cell structures generate a plurality of first output signals and the noise quantization signals. A plurality of adder modules receive the first output signals and performing either addition or subtraction on a selected combination of the first output signals, the adder modules generate a plurality of second output signals. A plurality of division modules receive the second output signals and perform a division operation on the second output signals by a predetermined factor. The division modules generate a plurality of final output signals of the MIMO.

According to another aspect of the invention, there is provided a method of forming a multi-input-multi-output-system (MIMO). The method includes providing a first input signal and a second input signal. A plurality of analog-to-digital converter (ADC) cell structures are provided that receives as input a combination of a first input signal and a second input signal as well as a combination of quantization noise signals from the respective other ADC cell structures of the plurality of ADC cell structures. The ADC cell structures generate a plurality of first output signals and the noise quantization signals. Also, the method includes receiving the first output signals and performing either addition or subtraction on a selected combination of the first output signals using a plurality of adder modules. The adder modules generate a plurality of second output signals. Furthermore, the method includes receiving the second output signals and performing a division operation on the second output signals by a predetermined factor using plurality of division modules. The division modules generate a plurality of final output signals of the MIMO.

These and other objectives of the present invention will no doubt become obvious to those of ordinary skill in the art after reading the following detailed description of the preferred embodiment that is illustrated in the various figures and drawings.

DETAILED DESCRIPTION

The invention provides a MIMO arrangement that reduces MIMO ADC area and power while the signal-to-noise ratio remains unchanged. This is based on the inventive MIMO design using noise coupled delta-sigma ADCs, where a number of single delta-sigma ADC cells are arranged to receive as input a combination of two analog input signals and a combination of the various noise quantization output signals associated with the respective other single delta-sigma ADC cells associated with the inventive MIMO.

Figure 1:
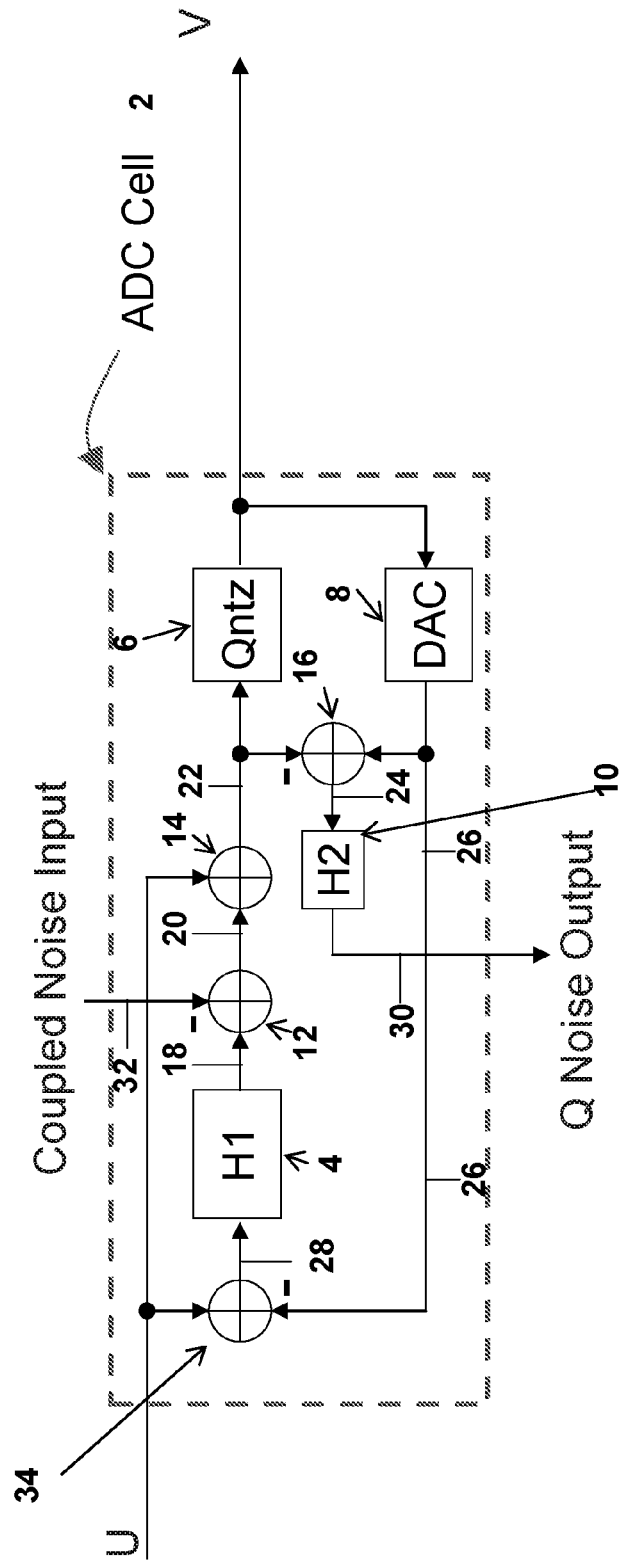
FIG. 1 is a schematic diagram illustrating a single ADC cell used in accordance with the invention.

FIG. 1 is a schematic diagram illustrating the single ADC cell used in accordance with the invention. The ADC cell 2 receives as input an analog input signal U. An adder module 34 that receives as input the signal U and an output signal 26 from a digital-to-analog converter (DAC) 8. The adder module 34 performs addition on the signal U and output signal 26, and outputs a signal 28. A circuit transfer function module 4 receives as input the signal 28 and performs correlation on the signal 28 using a specified factor H1. The circuit transfer function 4 outputs a signal 18. An adder module 12 subtracts the signal 18 from the input signal U. The adder module 12 performs addition on the signal and a coupled noise input signal 32, and outputs a signal 20. The coupled noise input signal 32 is a signal associated the quantized noise signal of the other different ADC cells in the inventive MIMO. An adder module 14 receives as input the signal 20 and the input signal U and performs an addition operation on these signals. Moreover, the adder module 14 outputs a signal 22 that is sent to a quantizer 6 and adder module 16. The quantizer 6 performs its respective quantization operation on the signal 22 and outputs a signal V that is the overall output of the ADC cell 2. The DAC 8 receives as input the signal V and performs its respective digital to analog conversion on the signal V and outputs a signal 26 that is an analog signal. The adder module 16 receives as input the signal 22 and the signal 26 and performs a subtraction operation on these signals. The adder module 16 outputs a signal 24. A quantization noise transfer function 10 receives as input the signal 24 and performs its respective noise correlation and outputs a quantization noise signal 30.

The ADC cell 2 can be implemented by a wide class of delta sigma ADCs. In this example, a single loop implementation is shown where the feedforward path is composed of the circuit transfer function 4 and the quantizer 6, while the feedback path is composed of the DAC 8.

Figure 2:
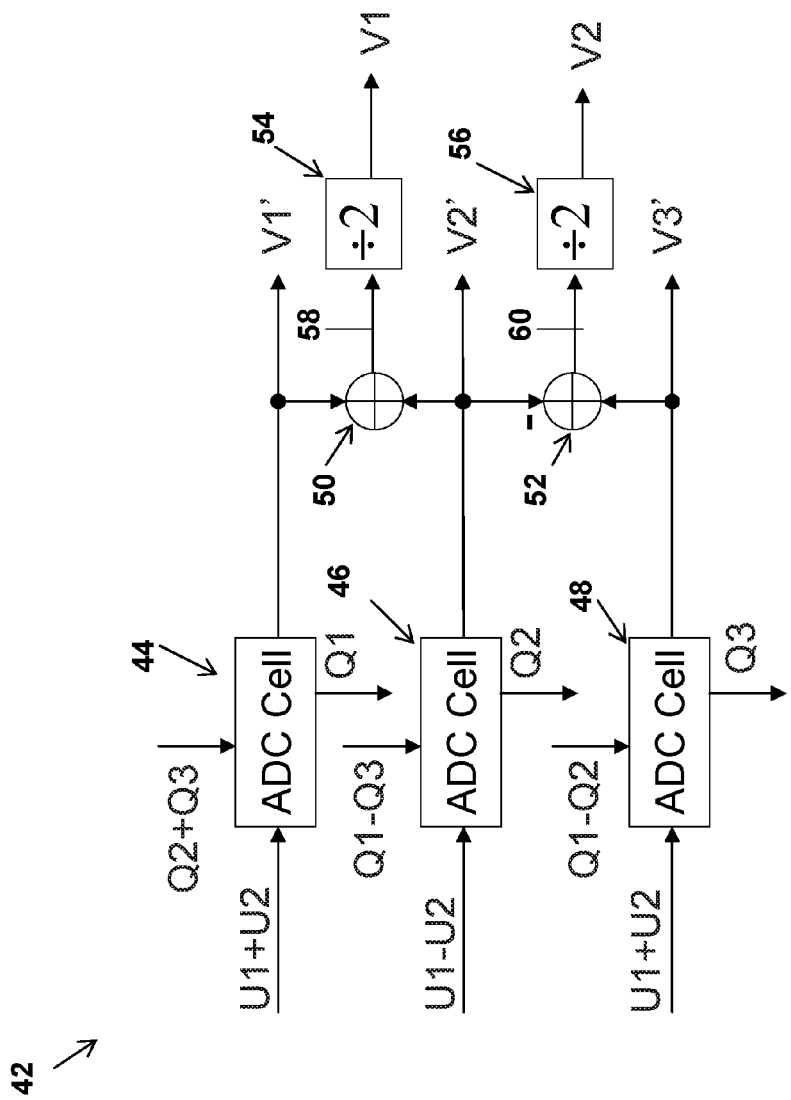
FIG. 2 is a schematic diagram illustrating an inventive MIMO ADC configured in accordance with the invention.

FIG. 2 is a schematic diagram illustrating inventive MIMO ADC 42 formed in accordance with the invention. The MIMO ADC 42 includes a first ADC cell 44, a second ADC cell 46,` and a third ADC cell 48. Each of the ADC cells 44, 46, 48 have a quantization noise transfer functions H1, H2, and H3 that produces quantization noise Q1, Q2, and Q3, as show in FIG. 2. In this case, the quantization noise transfer functions H1, H2, and H3 are equal. The MIMO ADC structure 42 includes two input signals U1, U2 and two output signals V1, V2. The first ADC cell 44 receives as input the signal U1+U2 and a quantization noise signal Q2+Q3, and generates the quantization noise signal Q1 and a quantizer signal V1'. The second ADC cell 46 receives as input the signal U1−U2 and the quantization noise input signal Q1−Q3, and generates the quantization noise signal Q2 and a quantizer signal V2'. The third ADC cell 48 receives as input the signal U1+U2 and the quantization noise input signal Q1−Q2, and generates the quantization noise signal Q3 and a quantizer signal V3'. The first ADC cell 44, second ADC cell 46, and third ADC cells 48 are similar to the ADC cell 2 described in FIG. 1.

An adder module 50 receives the quantizer signals V1' and V2' as input and performs addition on these signals. The adder module 50 outputs a signal 58. A division module 54 receives the signal 58 as input and performs a division operation by a predetermined factor which is in this case to be 2. The division module 54 outputs a signal V1, which is one of the two inputs of the inventive MIMO 42.

An adder module 52 receives the quantizer signals V2' and V3' as input and performs subtraction on these signals. The adder module 52 outputs a signal 60. A division module 56 receives the signal 60 as input and performs a division operation by a predetermined factor which is in this case to be 2. The division module 56 outputs a signal V2, which is one of the two inputs of the inventive MIMO 42.

The output signal V1 is equal to the sum of V1' and V2' as follows $$V1 = \frac{V1' + V2'}{2} = \frac{2U1 + NTF(1-H2)(Q1+Q2)}{2} \quad \text{Eq. 1}$$

where NTF is the noise transfer function of the ADC cell. The output signal V2 is equal to the subtraction of V2' from V3' divided by 2 as follows:

$$V2 = \frac{V2' - V3'}{2} = \frac{2U1 + NTF(1-H2)(-Q2+Q3)}{2} \quad \text{Eq. 2}$$

As can be seen from the equations above, the effectiveness of the quantization noise shaping has increased by (1−H2).

The invention allows the implementation of each cell to be a delta sigma ADC with any topology that allows for the input of the quantizer to the measured. This allows for the use of all delta sigma topologies with the exception of VCO based quantizers. The use of single loop designs would be preferable to cascaded or mash implementation due to its relative insensitivity to global component variations. The implementation of the delta sigma ADC can be discrete time or continuous time. Discrete time implementations have better jitter insensitivity while continuous-time provide inherent anti-aliasing. The quantization noise coupling transfer function H2 can simply be a delay ($z^{-1}$) to increase the modulator order by one (1−H2=(1−$z^{-1}$)). H2 can also be a higher order transfer function so that (1−H2=(1−$z^{-1}$)$^n$) increasing the modulator order by n, and can be chosen to produce complex conjugate zeros on the unit circle. Moreover, the invention allows quantization noise coupling transfer function H2 to be defined as (2−1/k)$z^{-1}$−$z^{-2}$ where k is an integer to produce zeros at direct current or complex conjugate zeros on the unit circle at frequencies other then direct current.

The invention provides several benefits, for example, the reduction in area for the same signal noise ratio performance, and the reduction in power for the same signal to noise ratio performance. Also, an increase in the order of quantization noise shaping due to the use of the noise coupling.

Although the present invention has been shown and described with respect to several preferred embodiments thereof, various changes, omissions and additions to the form and detail thereof, may be made therein, without departing from the spirit and scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-input-multi-output-system (MIMO) comprising:
   a first input signal and a second input signal;
   a plurality of analog-to-digital converter (ADC) cell structures that receives as input a combination of the first input signal and the second input signal as well as a combination of quantization noise signals from the respective other ADC cell structures of the plurality of ADC cell structures, the ADC cell structures generate a plurality of first output signals and said noise quantization signals;
   a plurality of adder modules that receive the first output signals and performing either addition or subtraction on a selected combination of the first output signals, the adder modules generate a plurality of second output signals; and
   a plurality of division modules that receive the second output signals and perform a division operation on the second output signals by a predetermined factor, the division modules generate a plurality of final output signals of the MIMO.

2. The MIMO of claim 1, wherein the combination of the first input signal and the second input signal comprises adding the first input signal and the second input signal or subtracting the first input signal from the second input signal.

3. The MIMO of claim 1, wherein each of the ADC cell structures comprise quantization noise transfer functions to generate said noise quantization noise signals.

4. The MIMO of claim 3, wherein the quantization noise transfer functions are equivalent.

5. The MIMO of claim 1, wherein the ADC cell structures comprise three or more single ADC cell structures.

6. The MIMO of claim 1, wherein the ADC cell structures comprise delta-signal ADC structures.

7. The MIMO of claim 1, wherein the ADC cell structures are arranged so that each ADC cell structure comprises a feedforward path having a first transfer function and a quantizer.

8. The MIMO of claim 1, wherein the ADC cell structures are arranged so that each ADC cell structure comprises a feedback path having a digital-to-analog converter (DAC).

9. The MIMO of claim 3, wherein the quantization noise transfer functions comprise zeros at direct current.

10. The MIMO of claim 3, wherein the quantization noise transfer functions comprise complex conjugate zeros on the unit circle at frequencies other than direct current.

11. A method of forming a multi-input-multi-output-system (MIMO) comprising:
    providing a first input signal and a second input signal;

providing a plurality of analog-to-digital converter (ADC) cell structures that receives as input a combination of a first input signal and a second input signal as well as a combination of quantization noise signals from the respective other ADC cell structures of the plurality of ADC cell structures, the ADC cell structures generate a plurality of first output signals and said noise quantization signals;

receiving the first output signals and performing either addition or subtraction on a selected combination of the first output signals using a plurality of adder modules, the adder modules generate a plurality of second output signals; and receiving the second output signals and perform a division operation on the second output signals by a predetermined factor using a plurality of division modules, the division modules generate a plurality of final output signals of the MIMO.

12. The method of claim 11, wherein the combination of the first input signal and the second input signal comprises adding the first input signal and the second input signal or subtracting the first input signal from the second input signal.

13. The method of claim 11, wherein each of the ADC cell structures comprises quantization noise transfer functions to generate said quantization noise signals.

14. The method of claim 13, wherein the quantization noise transfer functions are equivalent.

15. The method of claim 11, wherein the ADC cell structures comprise 3 or more single ADC cell structures.

16. The method of claim 11, wherein the ADC cell structures comprise delta-signal ADC structures.

17. The method of claim 11, wherein the ADC cell structures are arranged so that each ADC cell structure comprises a feedforward path having a first transfer function and a quantizer.

18. The method of claim 11, wherein the ADC cell structures are arranged so that each ADC cell structure comprises a feedback path having a digital-to-analog converter (DAC).

19. The method of claim 13, wherein the quantization noise transfer functions comprise zeros at direct current.

20. The method of claim 13, wherein the quantization noise transfer functions comprise complex conjugate zeros on the unit circle at frequencies other than direct current.

* * * * *